(12) United States Patent
Bone

(10) Patent No.: US 12,727,122 B1
(45) Date of Patent: Sep. 1, 2026

(54) PASSIVE THERMALLY-SWITCHED HEAT TRANSFER SYSTEM

(71) Applicant: United States of America as represented by the Administrator of NASA, Washington, DC (US)

(72) Inventor: Jarret Carl Bone, Madison, AL (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 279 days.

(21) Appl. No.: 18/735,321

(22) Filed: Jun. 6, 2024

(51) Int. Cl.
*H05K 7/20* (2006.01)
*F03G 7/06* (2006.01)
*F28D 15/06* (2006.01)

(52) U.S. Cl.
CPC ..... *H05K 7/20381* (2013.01); *H05K 7/20336* (2013.01); *F03G 7/06113* (2021.08); *F03G 7/0641* (2021.08); *F28D 15/06* (2013.01)

(58) Field of Classification Search
CPC ............ H05K 7/20381; H05K 7/20336; F03G 7/0641; F03G 7/06113; F28D 15/06; F28F 2013/008
See application file for complete search history.

(56) References Cited

U.S. PATENT DOCUMENTS 1,006,552 A 10/1911 Hick
3,399,717 A * 9/1968 Cline .................... G05D 23/01 244/1 R
3,805,528 A * 4/1974 Huebscher .......... F03G 7/06113 60/530
3,957,107 A * 5/1976 Altoz ...................... F28D 15/06 174/15.2
4,092,874 A * 6/1978 Stange ................ F03G 7/06113 60/527
4,281,708 A * 8/1981 Wing ...................... F28F 27/00 165/277
4,388,965 A * 6/1983 Cunningham ....... G05D 23/192 165/277

(Continued)

OTHER PUBLICATIONS

Bone, Jarret; Pore, Aaditya; Passive PCB Mounted Thermal Switch, Poster, Jun. 22, 2023, NASA/Marshall Space Flight Center, Huntsville, AL USA.

*Primary Examiner* — Travis Ruby
(74) *Attorney, Agent, or Firm* — Jerry L. Seemann; Trenton J. Roche

(57) ABSTRACT

A heat transfer system includes a heat-conducting frame having a base in thermal engagement with a heat source and two legs extending from the base. A wax motor in thermal engagement with one of the frame's legs has a piston that moves towards the frame's second leg when the heat source is heated to a temperature threshold. A thermal conductor's first end is disposed between the piston and the frame's second leg, and the thermal conductor's second end is in thermal engagement with a cold source. Springs coupled to the thermal conductor move its first end into thermal engagement with the frame's second leg in correspondence with movement of the piston when the heat source is heated to the temperature threshold. The springs also move the thermal conductor's first end out of thermal engagement with the frame's second leg when the heat source is cooled to below the temperature threshold.

18 Claims, 6 Drawing Sheets

(56) References Cited

U.S. PATENT DOCUMENTS

| | | | | |
|---|---|---|---|---|
| 4,402,358 | A * | 9/1983 | Wolf | F28D 15/04 257/E23.088 |
| 4,676,300 | A * | 6/1987 | Miyazaki | B64G 1/50 165/277 |
| 5,379,601 | A * | 1/1995 | Gillett | G05D 23/01 62/298 |
| 5,535,815 | A * | 7/1996 | Hyman | G05D 23/024 165/277 |
| 5,549,155 | A | 8/1996 | Meyer, IV et al. | |
| 10,371,459 | B1 * | 8/2019 | Reist | F28F 13/06 |
| 2007/0236887 | A1 | 10/2007 | Cheng et al. | |
| 2014/0015106 | A1 | 1/2014 | Hsieh et al. | |
| 2015/0289414 | A1 | 10/2015 | Berard et al. | |
| 2016/0118315 | A1 | 4/2016 | Smith et al. | |
| 2017/0077010 | A1 | 3/2017 | Yan et al. | |
| 2017/0238442 | A1 | 8/2017 | Zhang | |
| 2017/0321966 | A1 * | 11/2017 | Lueckenbach | F28D 15/0233 |
| 2017/0363371 | A1 * | 12/2017 | David | F28F 5/00 |
| 2019/0104608 | A1 | 4/2019 | Laurent et al. | |
| 2019/0179351 | A1 * | 6/2019 | Andres | H01M 10/63 |
| 2024/0096741 | A1 | 3/2024 | Geng et al. | |

* cited by examiner

PASSIVE THERMALLY-SWITCHED HEAT TRANSFER SYSTEM

ORIGIN OF THE INVENTION

The invention described herein was made by an employee of the United States Government and may be manufactured and used by or for the Government of the United States of America for governmental purposes without the payment of any royalties thereon or therefore.

BACKGROUND OF THE INVENTION

1. Field of the Invention

This disclosure relates to heat transfer systems. More specifically, the disclosure relates to a passive heat transfer system that is thermally switched between its heat-transfer and non-heat-transfer modes.

2. Description of the Related Art

Many electronics components generate heat during their operation. While some heat may be acceptable, too much heat may impact a component's functionality and, over time, may damage the component and/or other nearby components. Accordingly, many electronics systems include some type of heat removal or heat transfer functionality. In general, heat transfer devices/systems may be passive (e.g., finned heat sinks or radiators) or active (e.g., powered devices). For size or weight sensitive electronic systems, many conventional passive and active heat transfer devices may be too bulky or heavy, respectively, for a particular application. Furthermore, if an electronic system's processor overhead or electrical power usage are concerns, active heat transfer systems may preempt critical resources thereby negatively impacting an electronic system's operation.

The above-noted concerns are exacerbated for electronic systems that must operate in a vacuum environment as is the case with space environments that also present challenges in terms of temperature variations. In vacuum/space environments, excessive electronic component-generated heat may only be removed or transferred by conduction or radiation. For example, in many spaced-based applications, heat-generating electronic components are mounted on a printed circuit board (PCB) that, in turn, is mounted in a case that is exposed to a thermally cycling space environment. In order to reject heat effectively, the components need to be thermally conductive to a cold source such as the case. However, when the case temperature gets too low, too much heat may be rejected from the components that, in turn, may lead to component failure. Any attempt to solve this problem must keep in mind certain design criteria. Briefly, the heat transfer mechanism must be small in order to minimize impact on the PCB layout. The weight of the heat transfer mechanism must be such that it avoids inducing loads on the PCB in vibration environments. Finally, the heat transfer mechanism should be passive so it does not increase processor or power overhead.

SUMMARY OF THE INVENTION

Accordingly, it is an object of the present disclosure to describe a passively-operating heat transfer system for electronics components.

Another object of the present disclosure is to describe a passive heat transfer system adapted for use with electronic systems that are to operate in a space environment.

Other objects and advantages of the methods and systems described herein will become more obvious hereinafter in the specification and drawings.

In accordance with the present disclosure, a passive thermally-switched heat transfer system includes a heat-conducting frame having a base, a first leg extending from the base, and a second leg extending from the base. The first leg and second leg are disposed in spaced-apart opposition. The base is adapted to be in thermal engagement with a heat source. A wax motor is coupled to and in thermal engagement with the first leg. The wax motor has a piston operable for movement towards the second leg when the heat source is heated to a temperature threshold. A thermal conductor has a first end and a second end. The first end is disposed between the piston and second leg, and the second end is adapted to be in thermal engagement with a cold source. A set of springs is coupled to the first end of the thermal conductor. The set of springs is operable to move the first end into thermal engagement with the second leg in correspondence with the movement of the piston when the heat source is heated to the temperature threshold. The set of springs is also operable to move the first end out of thermal engagement with the second leg when the heat source is cooled to below the temperature threshold.

BRIEF DESCRIPTION OF THE DRAWING(S)

Other objects, features and advantages of the methods and systems described herein will become apparent upon reference to the following description of the preferred embodiments and to the drawings, wherein corresponding reference characters indicate corresponding parts throughout the several views of the drawings and wherein.

Figure 5:
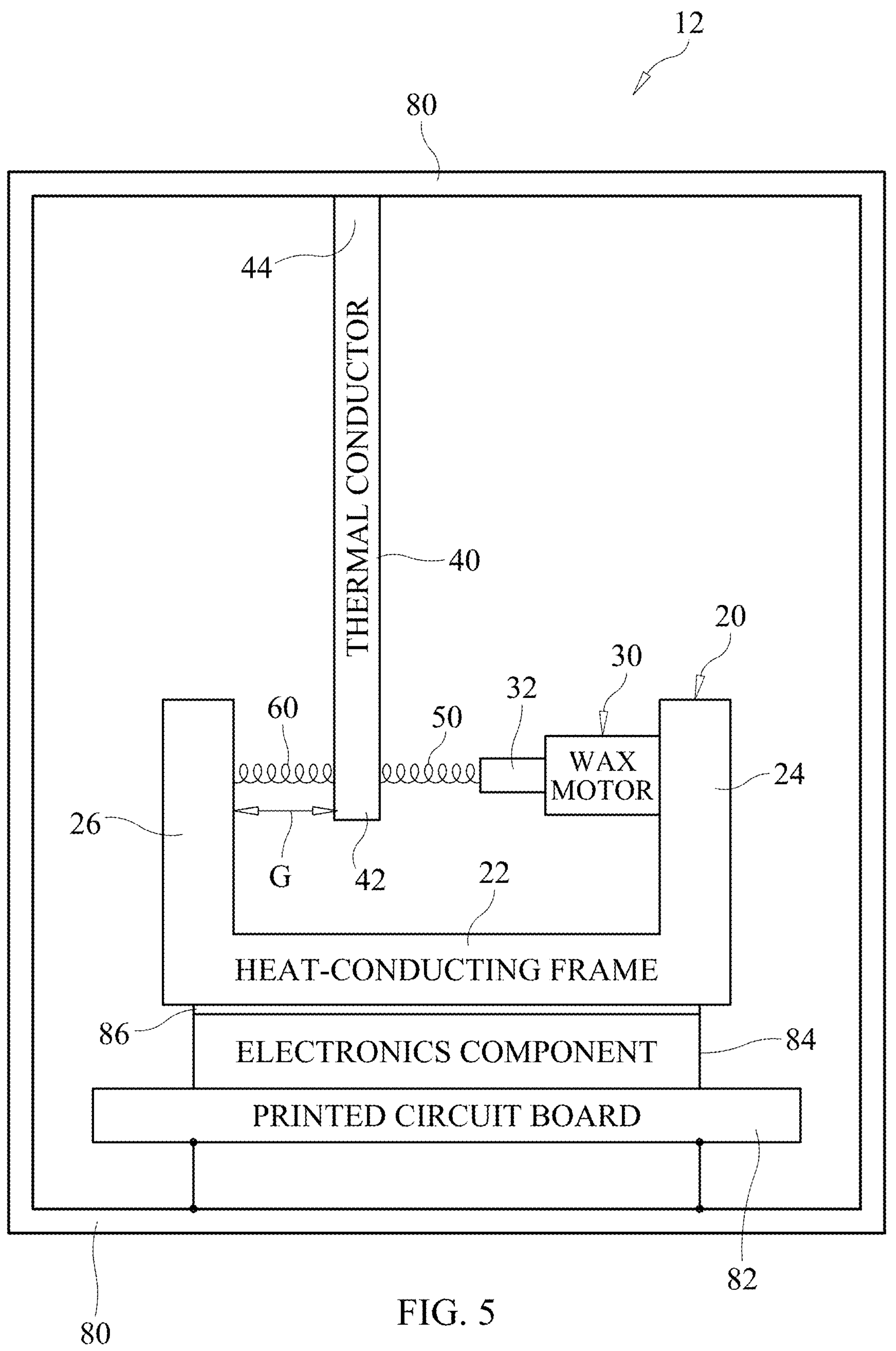
Figure 6:
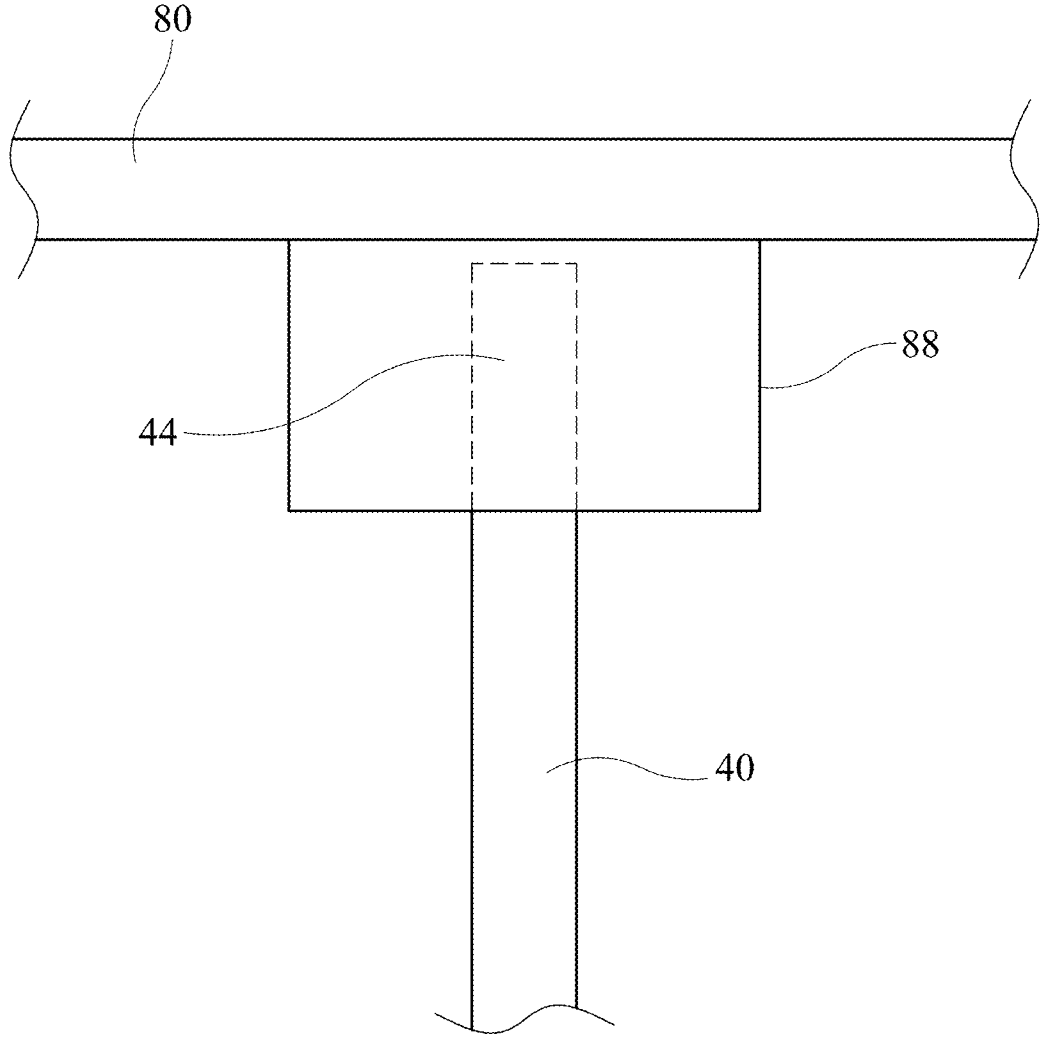

FIG. 5 is a schematic view of another embodiment of a passive thermally-switched heat transfer system that includes an electronics system configured for a space environment in accordance with various aspects as described herein; and FIG. 6 is a side view of a portion of an electronics case with the heat transfer system's thermal conductor encased in a sleeve that is in thermal engagement with the electronics case in accordance with various aspects as described herein.

DESCRIPTION OF THE PREFERRED EMBODIMENT(S)

Figure 1:
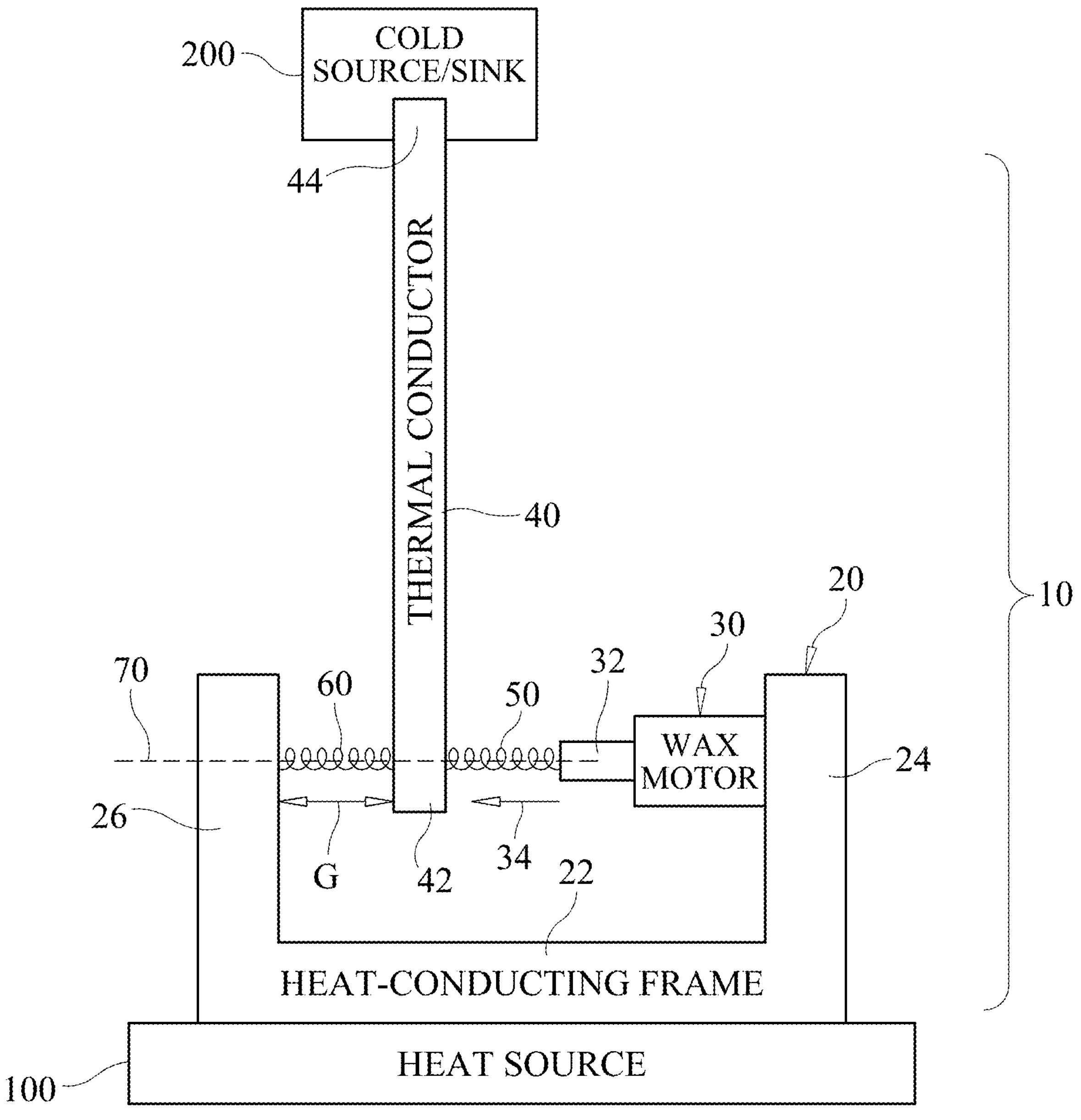
FIG. 1 is a schematic view of one embodiment of a passive thermally-switched heat transfer system in accordance with various aspects as described herein.

Referring now to the drawings and more particularly to FIG. 1, an embodiment of a passive thermally-switched heat transfer system in accordance with the present disclosure is shown and is referenced generally by numeral 10. Heat transfer system 10 may be configured and adapted to be coupled to and/or incorporated into a variety of heat-generating devices/systems to define a heat transfer path from one or more heat sources to a cold source or sink.

As will be explained further below, heat transfer system 10 passively switches into a conductive heat transfer mode when a heat source heats up to a threshold temperature but also passively switches out of the conductive heat transfer mode when the heat source cools to a temperature that is less than the threshold temperature. By way of example as will be described later herein, the heat transfer system of the present invention may be coupled to and/or incorporated into an electronics system that must operate in a space environment where the electronics system is subjected to wide, and possibly cyclical, variations in temperature.

Heat transfer system 10 defines a conductive heat transfer path between a heat source 100 and a cold source or sink 200 only during times that heat source 100 attains and remains above a threshold temperature. At all other times (i.e., when the temperature of heat source 100 is less than the threshold temperature), heat transfer system 10 does not define a conductive heat transfer path between heat source 100 and cold source/sink 200.

Heat transfer system 10 includes a heat-conducting frame 20, a wax motor 30, a generally elongate thermal conductor 40, and a set of springs that includes springs 50 and 60 in the illustrated embodiment. Heat-conducting frame 20 may be made from a heat-conducting metal such as aluminum or copper. Frame 20 has a base 22 that is in thermal engagement with heat source 100 via direct or indirect contact with heat source 100. Frame 20 also has spaced-apart opposing legs 24 and 26 that extend up and away from base 22. In some embodiments, frame 20 may be a U-shaped contiguous-material structure.

Wax motor 30 is coupled to leg 24 such that the phase-change portion (not shown) of wax motor 30 is in thermal engagement with leg 24. As is known in the art, wax motors are linear actuator devices that convert thermal energy into a mechanical displacement by taking advantage of the phase-change behavior of waxes that undergo expansion as the wax heats/melts. Wax motor 30 includes a piston 32 that moves linearly from wax motor 30 (as indicated by arrow 34) during heating/melting of the motor's wax (not shown) as is well-known in the art. It is to be understood that the particular choice of wax motor is not a limitation of the present invention.

Thermal conductor 40 may be any element or device that efficiently conducts heat along its length during the heat transfer operation of heat transfer system 10. In some embodiments, thermal conductor 40 may be a strip or bar of heat-conducting metal such as aluminum or copper. In some embodiments, thermal conductor 40 may possess a degree of elastic flexibility for reasons that will be explained later herein. In some embodiments, thermal conductor 40 may be a heat pipe. As is known in the art, a heat pipe employs a phase transition to transfer heat between hot and cold solid surfaces contained within the heat pipe. Between the solid surfaces, a volatile liquid turns into vapor at the hot surface with the vapor traveling towards the cold surface. At the cold surface, the vapor is condensed to release the heat into the cold surface. The choice of heat pipe is not a limitation of the present invention.

Regardless of its construction, thermal conductor 40 has one end 42 and an opposing end 44. The one end 42 is engaged on opposing sides by springs 50 and 60. The opposing end 44 is in thermal engagement with cold source/sink 200. When thermal conductor 40 is a heat pipe, the heat pipe's hot surface (not shown) is located at the one end 42 and the heat pipe's cold surface (not shown) is located at opposing end 44.

Spring 50 is coupled to piston 32 and the one end 42 of thermal conductor 40. Spring 50 may be a compression spring that applies and maintains a spring force to one side of the one end 42 throughout an operating temperature range of heat transfer system 10. Spring 60 is coupled to the one end 42 of thermal conductor 40 and to leg 26 of frame 20. Spring 60 may be a compression spring that applies a spring force to an opposing side of the one end 42. In the illustrated embodiment, springs 50 and 60 are axially aligned with one another (as indicated by a dashed line 70) and are disposed on opposing sides of the one end 42.

In operation, springs 50 and 60 have their spring constants configured to maintain a gap "G" between leg 26 and the one end 42 of thermal conductor 40 whenever heat generated by heat source 100 is less than a threshold temperature "TT". Wax motor 30 is configured to experience phase-change-induced movement 34 of piston 32 whenever heat generated by heat source 100 attains and exceeds threshold temperature TT. Springs 50 and 60 also have their spring forces configured such that springs 50 and 60 compress during movement 34 of piston 32 until gap G is eliminated and the one end 42 of thermal conductor 40 is in thermal engagement with leg 26 of frame 20. When this occurs, frame 20 conducts heat from heat source 100 to the one end 42 whereby heat is transferred to opposing end 44 that is in thermal engagement with cold source/sink 200 to thereby cool heat source 100 as heat is removed therefrom. When heat source 100 cools to a temperature below the temperature threshold TT, phase-change-induced movement 34 reverses as springs 50 and 60 cooperate to re-establish gap G between leg 26 and the one end 42. Since spring 50 is configured to maintain a spring force between piston 32 and the one end 42 at all times, piston 32 will never experience a "dead head" condition which could damage wax motor 30. The above-described process is passively repeated each time heat source 100 transitions the threshold temperature TT. As mentioned above, thermal conductor 40 may possess a degree of elastic flexibility to accommodate the back-and-forth movement of thermal conductor 40 across gap G during operation of heat transfer system 10.

Figure 2:
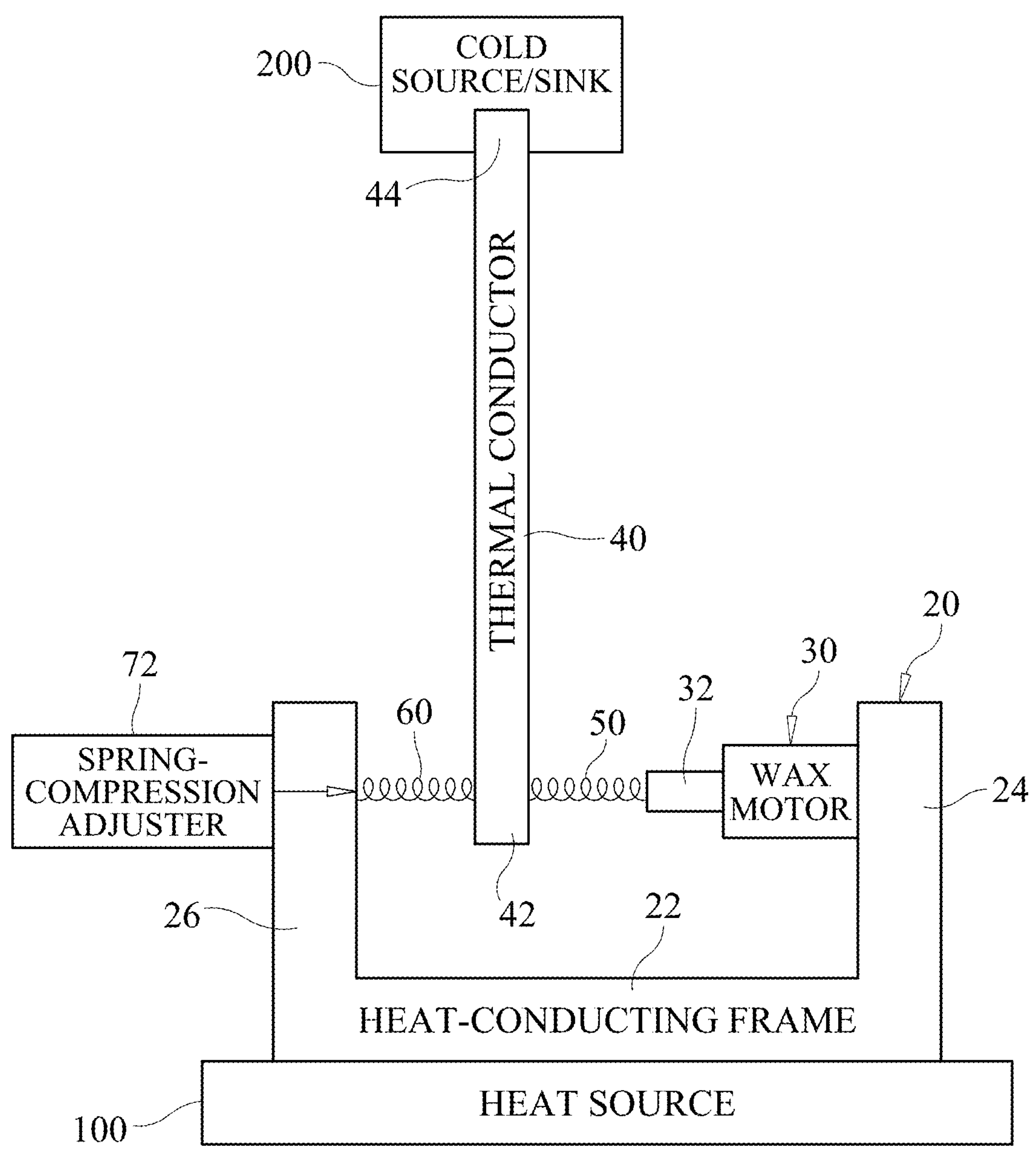
FIG. 2 is a schematic view of another embodiment of a passive thermally-switched heat transfer system further including a spring-compression adjuster in accordance with various aspects as described herein.

In some embodiments, the heat transfer system may be configured for adjustment of the spring force associated with spring 50 and/or spring 60. For example and with reference to FIG. 2, a spring-compression adjuster 72 may be provided for engagement with spring 60. In some embodiments, spring-compression adjuster 72 may be a simple mechanical device such as a set screw disposed in leg 26 and cooperating with spring 60.

Figure 3:
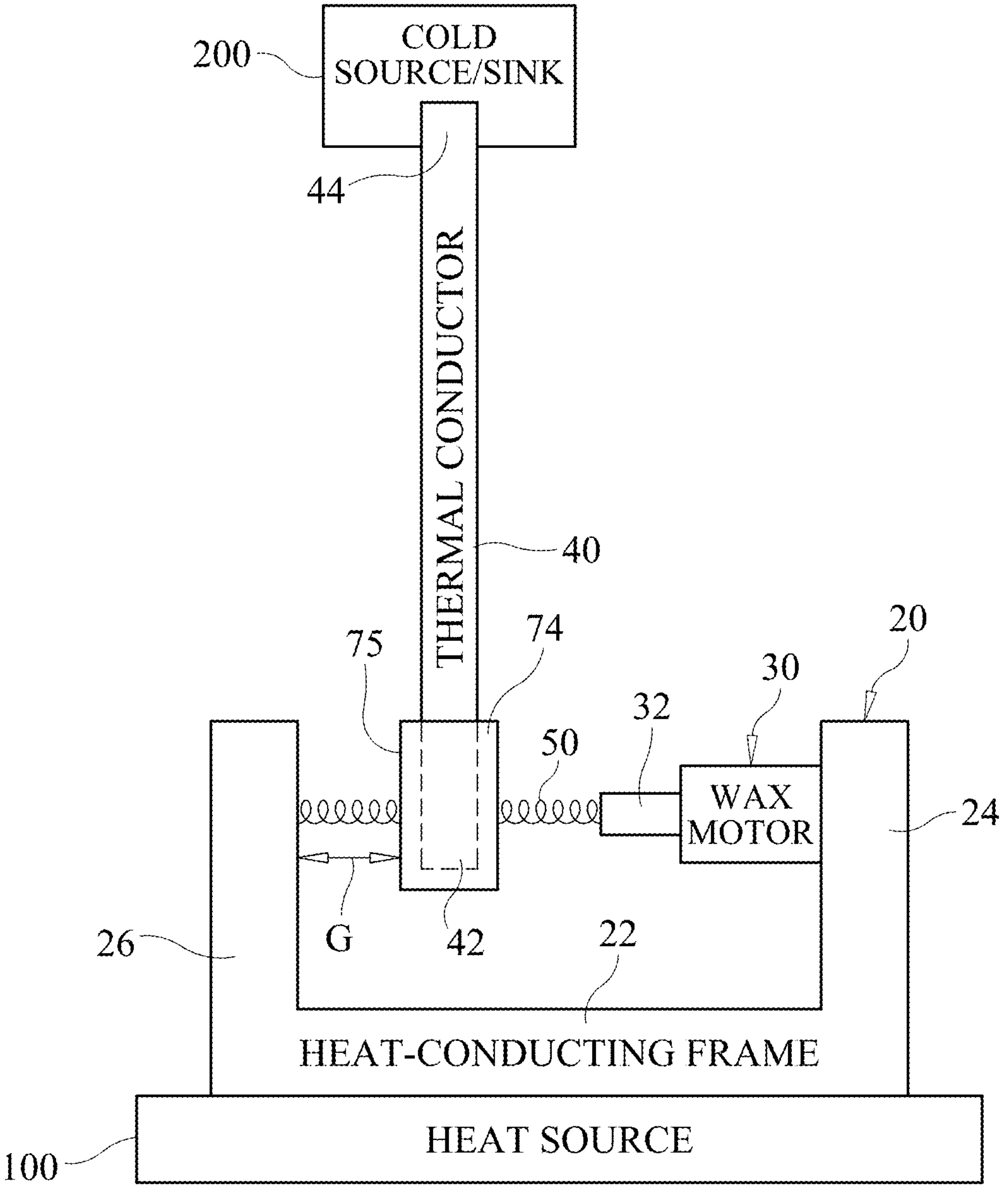
FIG. 3 is a schematic view of another embodiment of a passive thermally-switched heat transfer system further including a sleeve-like housing for increasing thermal contact surface area between the heat transfer system's thermal conductor and the heat transfer system's frame in accordance with various aspects as described herein.

In some embodiments, it may be desirable to protect the one end 42 of thermal conductor 40 and increase thermal contact between the one end 42 and leg 26 when gap G is eliminated. For example and with reference to FIG. 3, a heat-conducting sleeve-like housing 74 may be provided to encase and thermally engage the one end 42. In general, housing 74 presents a face 75 having a larger surface area than end 42 to enhance heat transfer to leg 26 when gap G is eliminated. In this embodiment, springs 50 and 60 may be coupled to housing 74. In some embodiments, face 75 may be polished to present a smooth surface to further enhance heat transfer to leg 26 when in contact therewith. In some embodiments, thermal grease (not shown) may be provided on face 75.

Figure 4:
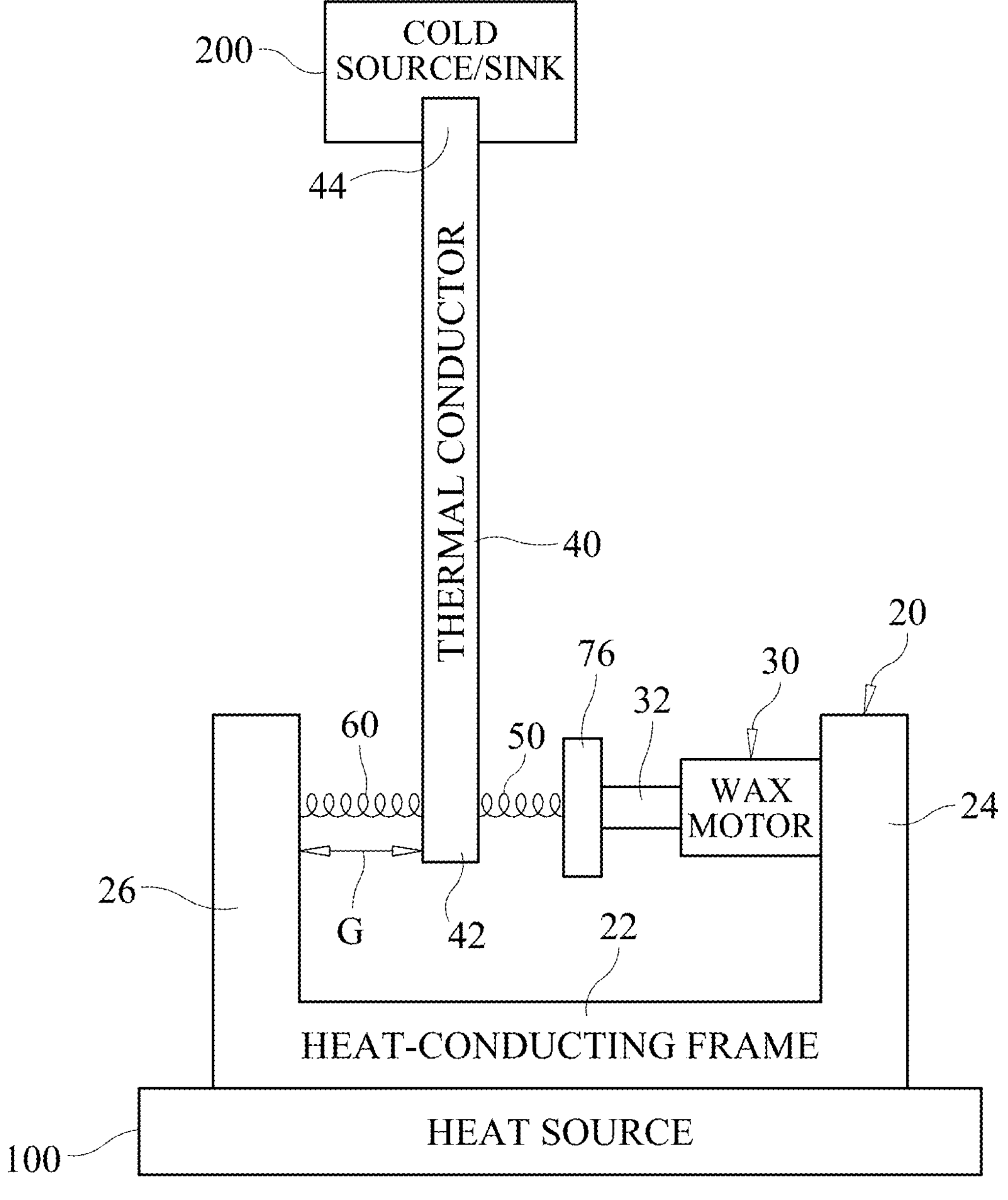
FIG. 4 is a schematic view of another embodiment of a passive thermally-switched heat transfer system further including a thermally-insulating head disposed between the wax motor's piston and one of the system's compression springs in accordance with various aspects as described herein.

In some embodiments, it may be desirable to protect the end of piston 32 and thermally insulate the one end 42 from heat conduction from wax motor 30 through spring 50. For example and with reference to FIG. 4, a heat-insulating head 76 may be disposed between piston 32 and spring 50.

As mentioned previously herein, the heat transfer system of the present invention may be an integrated part of an electronics system that is to be disposed in a space environment. For example and with reference to FIG. 5, a heat transfer system 12 may include any of the features described above and further includes a thermally-conductive case 80, a printed circuit board (PCB) 82 mounted in case 80, and at least one electronics component 84 (e.g., one or more integrated circuits/chips, power supplies, etc.) mounted on PCB 82. In some embodiments, a sheet 86 of thermal interface material may be disposed between base 22 and component 84 while also providing the needed thermal engagement between component 84 and base 22. Such thermal interface materials are well-known in the art.

In heat transfer system 12, component 84 is analogous to the above-described heat source 100 and case 80 is analogous to the above-described cold source/sink 200. In some embodiments, it may be desirable to protect opposing end 44 of thermal conductor 40 as well as enhance thermal engagement between opposing end 44 and case 80. For example and with reference to FIG. 6, opposing end 44 of thermal conductor 40 may be encased in a thermally-conductive sleeve 88 that is coupled to and in thermal engagement with case 80. Depending on size/weight constraints, sleeve 88 may be sized and shaped for optimal heat transfer to case 80.

The advantages of the present invention are numerous. The heat transfer system is a simple passive system that may repeatedly operate to switch into a heat transfer mode beginning at a set temperature threshold, and then switch out of the heat transfer mode when the temperature of a heat source drops below the temperature threshold. The system may be readily adapted to engage one or more components by modification of the system's frame.

Although the methods and systems presented herein have been described for specific embodiments thereof, there are numerous variations and modifications that will be readily apparent to those skilled in the art in light of the above teachings. For example, two or more of the various additional features described herein may be combined into a heat transfer system without departing from the scope of the present disclosure. It is therefore to be understood that, within the scope of the appended claims, the methods and systems presented herein may be practiced other than as specifically described.

What is claimed as new and desired to be secured by Letters Patent of the United States is:

1. A passive thermally-switched heat transfer system, comprising:

a heat-conducting frame having a base, a first leg extending from said base, and a second leg extending from said base wherein said first leg and said second leg are disposed in spaced-apart opposition, said base adapted to be in thermal engagement with a heat source;

a wax motor coupled to and in thermal engagement with said first leg, said wax motor having a piston operable for movement towards said second leg when the heat source is heated to a temperature threshold;

a thermal conductor having a first end and a second end, said first end disposed between said piston and said second leg, and said second end adapted to be in thermal engagement with a cold source; and a set of springs coupled to said first end of said thermal conductor, said set of springs operable to move said first end into thermal engagement with said second leg in correspondence with said movement of said piston when the heat source is heated to the temperature threshold, and said set of springs operable to move said first end out of thermal engagement with said second leg when the heat source is cooled to below the temperature threshold.

2. The passive thermally-switched heat transfer system of claim 1, wherein said thermal conductor comprises a heat pipe.

3. The passive thermally-switched heat transfer system of claim 1, further comprising a spring-compression adjuster coupled to at least one spring from said set of springs, said spring-compression adjuster operable to change spring force of said at least one spring.

4. The passive thermally-switched heat transfer system of claim 1, further comprising a thermally-conductive housing coupled to and in thermal engagement with said first end, said housing having a face whose surface area is greater than said first end wherein said face is moved into contact with said second leg in correspondence with said movement of said piston when the heat source is heated to the temperature threshold.

5. The passive thermally-switched heat transfer system of claim 1, wherein said set of springs comprises two axially aligned compression springs.

6. A passive thermally-switched heat transfer system, comprising:

a heat-conducting U-shaped frame having a base, a first leg extending from said base, and a second leg extending from said base;

a sheet of thermal interface material in thermal contact with said base and adapted to be in contact with at least one electronics component mounted on a printed circuit board;

a wax motor coupled to and in thermal engagement with said first leg, said wax motor having a piston operable for movement towards said second leg when the at least one electronics component is in operation and is heated to a threshold temperature;

a thermal conductor having a first end and a second end, said first end disposed between said piston and said second leg, and said second end adapted to be in thermal engagement with a cold source; and a set of springs coupled to said first end of said thermal conductor, said set of springs operable to move said first end into thermal engagement with said second leg in correspondence with said movement of said piston when the at least one electronics component is heated to the threshold temperature, and said set of springs operable to move said first end out of thermal engagement with said second leg when the at least one electronics component cools to below the threshold temperature.

7. The passive thermally-switched heat transfer system of claim 6, wherein said thermal conductor comprises a heat pipe.

8. The passive thermally-switched heat transfer system of claim 6, further comprising a spring-compression adjuster coupled to at least one spring from said set of springs, said spring-compression adjuster operable to change spring force of said at least one spring.

9. The passive thermally-switched heat transfer system of claim 6, further comprising a thermally-conductive housing coupled to and in thermal engagement with said first end, said housing having a face whose surface area is greater than said first end wherein said face is moved into contact with said second leg in correspondence with said movement of said piston when the heat source is heated to the temperature threshold.

10. The passive thermally-switched heat transfer system of claim 6, wherein said set of springs comprises two axially aligned compression springs.

11. A passive thermally-switched heat transfer system, comprising:

a thermally-conductive case adapted to be disposed in a space environment;

a printed circuit board (PCB) mounted in said case;

at least one electronics component mounted on said PCB, said at least one electronics component operable to perform at least one function in the space environment wherein said at least one electronics component generates heat;

a heat-conducting U-shaped frame having a base, a first leg extending from said base, and a second leg extending from said base;

a sheet of thermal interface material in thermal contact with said base and said at least one electronics component;

a wax motor coupled to and in thermal engagement with said first leg, said wax motor having a piston operable for movement towards said second leg when said heat generated by said at least one electronics component attains a threshold temperature;

a thermal conductor having a first end and a second end, said first end disposed between said piston and said second leg, and said second end in thermal engagement with said case; and a set of springs coupled to said first end of said thermal conductor, said set of springs operable to move said first end into thermal engagement with said second leg in correspondence with said movement of said piston when said at least one electronics component attains said threshold temperature, and said set of springs operable to move said first end out of thermal engagement with said second leg when said at least one electronics component cools to below said threshold temperature.

12. The passive thermally-switched heat transfer system of claim 11, wherein said thermal conductor comprises a heat pipe.

13. The passive thermally-switched heat transfer system of claim 11, further comprising a spring-compression adjuster coupled to at least one spring from said set of springs, said spring-compression adjuster operable to change spring force of said at least one spring.

14. The passive thermally-switched heat transfer system of claim 11, further comprising a thermally-conductive housing coupled to and in thermal engagement with said first end, said housing having a face whose surface area is greater than said first end wherein said face is moved into contact with said second leg in correspondence with said movement of said piston when said at least one electronics component generates said heat that is at or above said threshold temperature.

15. The passive thermally-switched heat transfer system of claim 11, wherein said set of springs comprises two compression springs disposed on opposing sides of said first end.

16. The passive thermally-switched heat transfer system of claim 15, further comprising a thermally-insulating piston head coupled to said piston and in engagement with one of said two compression springs.

17. The passive thermally-switched heat transfer system of claim 16, wherein said one of said two compression springs generates resistance to said movement of said piston when said at least one electronics component generates said heat that is at or above said threshold temperature.

18. The passive thermally-switched heat transfer system of claim 11, further comprising a thermally-conducting sleeve receiving said second end of said thermal conductor, said thermally-conductive sleeve coupled to and in thermal engagement with said case.

* * * * *